United States Patent
Nzama et al.

(10) Patent No.: US 10,047,455 B2
(45) Date of Patent: Aug. 14, 2018

(54) DIAMOND GRAINS, METHOD FOR MAKING SAME AND MIXTURE COMPRISING SAME

(71) Applicants: Element Six Abrasives S.A., Luxembourg (LU); Element Six Limited, County Clare (IE)

(72) Inventors: Mhlonishwa Cyprian Nzama, Oxfordshire (GB); Dale Anthony Thomson, Springs (ZA); Mark Gregory Munday, Oxfordshire (GB)

(73) Assignees: ELEMENT SIX ABRASIVES S.A., Luxembourg (LU); ELEMENT SIX LIMITED, County Clare (IE)

( * ) Notice: Subject to any disclaimer, the term of this patent is extended or adjusted under 35 U.S.C. 154(b) by 330 days.

(21) Appl. No.: 14/646,256

(22) PCT Filed: Dec. 10, 2013

(86) PCT No.: PCT/EP2013/076113
§ 371 (c)(1),
(2) Date: May 20, 2015

(87) PCT Pub. No.: WO2014/090814
PCT Pub. Date: Jun. 19, 2014

(65) Prior Publication Data
US 2015/0315722 A1    Nov. 5, 2015

Related U.S. Application Data

(60) Provisional application No. 61/736,381, filed on Dec. 12, 2012.

(30) Foreign Application Priority Data

Dec. 12, 2012  (GB) .................................. 1222383.0

(51) Int. Cl.
*C01B 32/25*   (2017.01)
*C30B 9/00*   (2006.01)
(Continued)

(52) U.S. Cl.
CPC .... *C30B 9/00* (2013.01); *B01J 3/06* (2013.01); *B01J 3/062* (2013.01); *B24D 3/02* (2013.01);
(Continued)

(58) Field of Classification Search
CPC ........ C09K 3/14; C04B 35/626; C04B 35/628
See application file for complete search history.

(56) References Cited

U.S. PATENT DOCUMENTS 4,399,167 A * 8/1983 Pipkin ................. C04B 20/1055
427/217
5,980,982 A 11/1999 Degawa et al.
(Continued)

FOREIGN PATENT DOCUMENTS

EP    0737510 A2   10/1996
WO   199929411 A1   6/1999
WO  2013156537 A1  10/2013

OTHER PUBLICATIONS

J.C. Sung et al, Thin Solid Films, Diamond growth on an array of seeds: The revolution of diamond production (2006), pp. 212-219.
(Continued)

*Primary Examiner* — Pegah Parvini
(74) *Attorney, Agent, or Firm* — Bryan Cave Leighton Paisner LLP

(57) ABSTRACT

A method of providing well-shaped diamond grains of at most about 100 microns in size. The method includes providing a synthesis assembly comprising a source of carbon material, a plurality of seed grains on which diamond material can crystallize, and solvent-catalyst material for promoting the crystallization of the diamond grains, and
(Continued)

Figure 1:
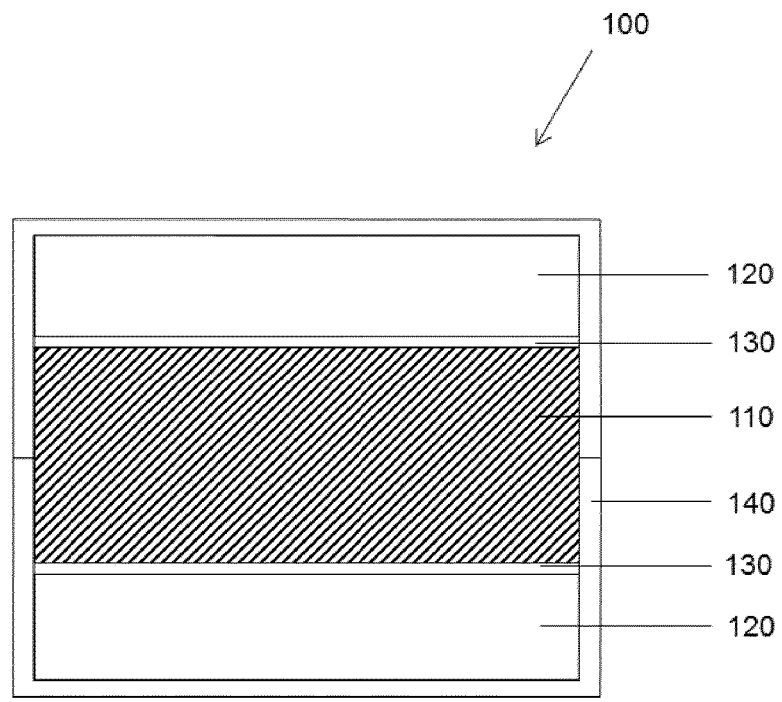

subjecting the synthesis assembly to a condition for growing the diamond grains. The synthesis condition is maintained long enough for at least about half of the carbon material to be converted into the diamond grains.

15 Claims, 3 Drawing Sheets

(51) Int. Cl.
*C09K 3/14* (2006.01)
*B24D 3/02* (2006.01)
*B24D 18/00* (2006.01)
*C30B 29/04* (2006.01)
*B01J 3/06* (2006.01)

(52) U.S. Cl.
CPC .......... *B24D 18/0009* (2013.01); *C01B 32/25* (2017.08); *C09K 3/1409* (2013.01); *C30B 29/04* (2013.01); *B01J 2203/061* (2013.01); *B01J 2203/062* (2013.01); *B01J 2203/068* (2013.01); *B01J 2203/0655* (2013.01); *C01P 2004/61* (2013.01)

(56) References Cited

U.S. PATENT DOCUMENTS

| | | |
|---|---|---|
| 7,585,366 B2 | 9/2009 | Sung |
| 2005/0136667 A1 | 6/2005 | Sung |
| 2008/0219914 A1 | 9/2008 | Smallman et al. |

OTHER PUBLICATIONS

M.W. Bailey and L.K. Hedges, Crystal Morphology Identification of Diamond and ABN, 1995, Industrial Diamond Review vol. 1/95, pp. 11 to 14.
Search Report for GB1222383.0 dated Dec. 10, 2013.
Search Report for GB1321825.0 dated Jun. 11, 2014.
Search Report for PCT/EP2013/076113 dated Sep. 30, 2014.

* cited by examiner

10μm

DIAMOND GRAINS, METHOD FOR MAKING SAME AND MIXTURE COMPRISING SAME

This disclosure relates generally to a diamond grain, more particularly to small diamond grains, to a method for making same and to mixtures comprising same.

A disclosed method for making the grains includes subjecting a source of carbon in the presence of a suitable metal material to a first ultra-high pressure of at least about 5.2 gigapascals (GPa) and a first temperature of about 1,400 degrees Celsius at which the metal is molten, thus inducing the spontaneous nucleation of a plurality of nuclei diamond grains from the carbon source. The pressure and temperature are then reduced to a second pressure and a second temperature at which the nuclei will grow by carbon precipitation to become a plurality of diamond grains, but at which substantial further spontaneous nucleation of diamond grains does not occur. After a period of time, the pressure and temperature are reduced to ambient levels and the grown diamond grains removed from the synthesis assembly comprising the remaining carbon source and metal, in which they are dispersed. The number of grains produced can be influenced by the magnitudes of the first pressure and the first temperature, and the period of time at this first condition, among other factors. The size of the diamond grains can be influenced by the magnitudes of the second pressure and second temperature, and the period of time at this second condition, among other factors.

There is a need for a method of synthesising high quality diamond grains having mean size of the order of magnitude of less than about ten microns, up to the order of tens of microns.

According to a first aspect, there is provided a method of providing a plurality of diamond grains having a mean size of greater than 5 microns or at least about 10 microns and at most about 100 microns, at most about 50 microns, at most about 30 microns or at most about 20 microns, the method including providing a synthesis assembly comprising a source of carbon material, a plurality of seed grains on which diamond material can crystallise, and solvent-catalyst material for promoting the crystallisation of the diamond grains; subjecting the synthesis assembly to a synthesis condition by means of an ultra-high pressure furnace, at which synthesis condition the pressure and temperature are such that the solvent-catalyst material is molten, diamond material can crystallise on the seed grains, and substantial spontaneous nucleation of diamond grains does not occur; the synthesis assembly being arranged such that carbon comprised in the source (at least some of the carbon comprised in the source, for example a substantial fraction or at least about half of the carbon comprised in the source) can migrate through the solvent-catalyst material and crystallise as diamond material on the seed grains at the synthesis condition; the synthesis condition being maintained for a synthesis period sufficient for at least about 50 percent, at least about 60 percent, at least about 70 percent, at least about 80 percent (in terms of weight) or substantially all of the of the carbon material comprised in the source to be converted into the plurality of diamond grains; the number of seed grains and the amount of carbon material comprised in the source being selected such that the synthesis condition can be maintained by the ultra-high pressure furnace for the synthesis period; reducing the pressure and temperature, and recovering the plurality of diamond grains from the synthesis assembly. The diamond grains may be substantially euhedral or subhedral.

Variations of the method are envisaged by this disclosure, of which the following are non-limiting, non-exhaustive examples.

Examples of carbon material for growing diamond may include graphite, carbon black or diamond-like carbon (which comprises carbon atoms bonded by sp2 and sp3 covalent bonds). In some examples, the carbon material may comprise diamond powder dispersed in the synthesis assembly, in which the powder grains may have a mean size of less than about 3 microns or less than about 1 micron, and or in the which the diamond powder grains may be irregularly shaped. While wishing not to be bound by a particular theory, diamond material may precipitate on the seed grains by a process of Ostwald ripening, in which fine diamond powder dissolves and the dissolved carbon re-precipitates on larger diamond grains. The fine diamond powder may thus serve as a source of carbon for growing diamond grains.

In some examples, the mass of the carbon material comprised in the synthesis assembly may be selected such that substantially all the carbon material is exhausted by the end of the synthesis period.

In some examples, the mean size of the diamond grains may be at most about 50 microns or at most about 20 microns. In various examples, the synthesised diamond grains may have a mean size of at least 10 microns and at most 50 microns, or at least 10 microns and at most 20 microns.

The seed grains may comprise diamond material. The seed grains may be diamond grains, which may have irregular shape or which may be substantially euhedral or subhedral. In some examples, the mean size of the seed grains may be at least about 0.5 micron or at least about 1 micron. In some examples, the mean size of the seed grains may be at most about 5 microns or at most about 3 microns. For example, the mean size of the seed grains may be at least 0.5 micron and at most 5 microns.

In some examples, the solvent-catalyst material may comprise metal material. The ratio of the mass of the solvent-catalyst material to the mass of the carbon material comprised in the synthesis assembly may be at least about 3 or at least about 4. The ratio of the mass of the solvent-catalyst material to the mass of the carbon material comprised in the synthesis assembly may be at most about 7 or at most about 10. The ratio of the mass of the solvent-catalyst material to the mass of the carbon material comprised in the synthesis assembly may be at least about 3 and at most about 10.

In some example, the solvent-catalyst material may comprise iron, nickel, cobalt or manganese or mixtures including two or more of these. In particular, powders comprising at least two of these metals may be blended together substantially in a eutectic ratio so that the combined materials will melt at a relatively low temperature to form a molten alloy. For example the solvent-catalyst material may comprise iron and nickel powder in the mass ratio 70:30, or it may comprise cobalt and iron powder in the mass ratio 80:20.

In some examples, the method may include providing a capsule assembly comprising a buffer assembly and the synthesis assembly, the buffer assembly being substantially free of seed grains; in which the buffer assembly and the synthesis assembly are configured and constituted such that the ultra-high pressure furnace is capable of maintaining the synthesis condition for the synthesis period. The buffer assembly may comprise at least one compact buffer body (as used herein, a compact body will mean a body comprising compacted particulate material). In some example arrangements, the capsule assembly may comprise at least two compact buffer bodies, each at a respective opposite end of the synthesis assembly.

In some examples, the buffer assembly may comprises the carbon material (i.e. carbon material in substantially the same form as the source of carbon material comprised in the synthesis assembly). The capsule assembly will be arranged such that carbon material that may be comprised in the buffer assembly will be substantially prevented from migrating to the seed grains. The capsule assembly may comprise a barrier structure for preventing substantial transfer of material between the synthesis assembly and the buffer assembly at the synthesis condition. In some examples, the solvent-catalyst material may comprise metal material and the buffer assembly may comprise the carbon material; the ratio of the combined mass of the solvent-catalyst material in the capsule assembly to the combined mass of the carbon material in the capsule assembly being at least 1 or at least 1.5 and at most 3 or at most 2. For example, this ratio may be at least 1 and at most 3.

In variations of the method, the buffer assembly may comprise or consist of material other than graphite, provided that the overall mechanical properties of the capsule assembly are such that the required pressure and temperature can be generated within the synthesis assembly and sustained for a sufficiently long period to produce the diamond grains.

In some examples, the pressure may be at least about 5 gigapascals or at least about 5.5 gigapascals. In some examples, the pressure may be at most about 5.9 gigapascals. In some examples, the pressure may be at least about 5.5 gigapascals and at most about 5.9 gigapascals.

In some exampled, the ultra-high pressure furnace may comprises three pairs of mutually opposable anvils for applying load to capsule assembly having substantially cubic external symmetry (a so-called cubic press). In some examples, the ultra-high pressure furnace may comprise four anvils arranged tetrahedrally (a so-called tetrahedral press) or the ultra-high pressure furnace may comprise a pair of opposable anvils and a die defining a cavity for accommodating the capsule assembly (a so-called belt press). In some examples, the ultra-high pressure furnace may comprise a Walker-type mechanism, or a piston and cylinder mechanism.

In some examples, the method may include heating the synthesis assembly to melt the catalyst material at a pressure at which diamond is less thermodynamically stable than the carbon source, allowing sufficient time for the catalyst material substantially throughout the volume of the synthesis assembly to melt, and then increasing the pressure so that the pressure or the synthesis assembly is sufficiently high for diamond to be more thermodynamically stable than the carbon source.

In some examples, the synthesis assembly may be subjected to a load and heat cycle comprising three stages, in which the first stage includes applying load onto the capsule assembly such that the pressure in the capsule assembly is increased at ambient temperature to a first pressure of less than 5 gigapascals; the second stage includes applying heat to the capsule assembly such that the solvent-catalyst material melts; and the third stage including increasing the load such that the pressure on the synthesis assembly is increased to at least about 5.5 gigapascals. The first pressure may be at least about 1 gigapascal, at least about 3 gigapascals or at least about 4 gigapascals.

In some arrangements, the synthesis assembly may comprise at least one compact synthesis body, comprising the source, the seed grains and the solvent-catalyst material. The compact synthesis body may comprise the source in particulate form and the solvent-catalyst material in particulate form, the source particles and solvent-catalyst particles being combined and compacted together. For example, the compact synthesis body may comprise graphite powder blended with solvent-catalyst metal powder. The diamond seed grains may be substantially uniformly, albeit randomly dispersed in the synthesis assembly.

In some examples, the content of the seed grains in the compact synthesis body may be at least 0.2 gram, at least 1 gram, at least 2 grams or at least 4 grams per kilogram of the compact synthesis body. In some examples, the content of the seed grains may be at most 1 gram, at most 2 grams, at most 4 grams or at most 10 grams per kilogram of compact synthesis body. In various examples, the content of the diamond seed grains may be in the ranges 0.2 gram to 1 gram, or 1 gram to 2 grams, or 2 grams to 4 grams, or 4 grams to 10 grams, per kilogram of compact synthesis body.

Some examples may include providing a plurality of diamond seed grains encapsulated in respective pellets comprising the solvent-catalyst material, combining the pellets with the carbon material and with each other, and compacting the pellets.

In some examples, the method may include processing the plurality of diamond grains to select a plurality of selected diamond grains. As an example, the processing may include subjecting the diamond grains to a magnetic field and selecting the selected diamond grains on the basis of the amount of magnetic metallic material that may be included in the diamond grains. As an example, the processing may include segregating and selecting selected diamond grains on the basis of size or shape, or size and shape.

In some examples, the method may include depositing material onto the surfaces of the selected diamond grains to provide microstructures attached to the respective surfaces of the selected diamond grains. In some examples, the material may be capable of reacting with carbon to form carbide compound material, and may be selected from the group consisting of nickel, boron, silicon, titanium, tungsten, molybdenum, tantalum; or the material may comprise or consist of titanium. In some example methods, the material may comprise carbide compound material and may be selected from the group consisting of boron carbide, silicon carbide, titanium carbide, tungsten carbide, molybdenum carbide and tantalum carbide; of the material may comprise of consist of titanium carbide. In some examples, the microstructure may comprise or consist of titanium carbide.

In some examples, the microstructure may be in the form of a layer at least partly or substantially completely covering the surface of each of the selected diamond grains.

In some examples, the method may include depositing the material onto the surfaces of the selected diamond grains by means of chemical vapour deposition (CVD), physical vapour deposition (PVD), atomic layer deposition (ALD), a packed bed method, or a combination of any of these means.

In some examples, the method may include dispersing a plurality of the selected diamond grains within binder material for a tool or precursor material for the binder material.

In some examples, the method may include combining a plurality of the selected diamond grains, which may each comprise or be free of a respective coating or other microstructure attached to its surface, with bond material for a tool or precursor material for bond material for a tool, to provide a mixture. The mixture may comprise the diamond grains dispersed in a solid matrix, vitreous material, resinous material, polymer material, within an electroplated layer, dry powder, slurry or paste comprising the bond material or precursor material for the bond material. Bond material and precursor material for bond material for tools such as saws and grinding wheels may include nickel, cobalt, iron, certain alloys, compounds or intermetallic materials comprising any of these, braze material (material suitable for joining other materials by brazing), tungsten carbide, resin material or precursor material for resin material, vitreous material or precursor material for vitreous material, silicon, silicon carbide or silica.

In some examples, the method may include attaching a plurality of the selected diamond grains to a body for a tool component such as an insert, wheel, segment, wire, blade for a tool. In some examples, the tool component may be for a grinding tools such as grinding wheels or a saw, such as a wire saw.

In some examples, a plurality of the selected diamond grains, which in some examples may comprise a coating comprising titanium carbide, may be attached to a tool body by means of a method including electroplating (also referred to as electro-deposition). In other examples, a plurality of the selected diamond grains may be combined with a bond material for a tool, or precursor material for bond material, providing a tool comprising a plurality of the diamond grains dispersed in a matrix comprising the bond material. In some examples, the plurality of the selected diamond grains may each comprise a microstructure, such as a coating or layer, attached to it, and in some examples at least some or substantially all of the plurality of the selected diamond grains may be substantially free of attached microstructure, and for example the plurality of the selected diamond grains may be uncoated.

In some examples, the method may include providing each of the selected diamond grains with coatings attached to their respective surfaces, the coating comprising or consisting of titanium, titanium carbide or titanium in elemental form and titanium carbide; combining the grains with metallic binder material for a cutting or grinding tool (a so-called "metal bond" abrasive tool) and dispersing the diamond grains in the binder material. While wishing not to be bound by a particular theory, a coating comprising at least TiC will likely enhance the bonding of the diamond grains to the metallic binder material in the tool and to improve retention of the grains in the binder when the tool is used, for example in cutting sapphire.

According to a second aspect, there is provided a diamond grain or a plurality of diamond grains having a mean size of at least 5 microns or at least about 10 microns and at most about 100 microns, at most about 50 microns, at most about 30 microns or at most about 20 microns, and being substantially euhedral or subhedral.

In some examples, the crystal habit or shape may include major surfaces corresponding to (100) and (111) crystallographic planes of diamond. Minor surfaces corresponding to other crystallographic planes may be present, such as the (110) or (113) crystallographic planes. In some examples, the diamond grain may have a morphology index of at least 3 or at least 4 and at most 7 or at most 6.

In some examples, the diamond grain or plurality of grains may comprise at least one microstructure attached to its surface (or their respective surfaces, as the case may be). The microstructure may comprise nickel, boron, silicon, titanium or tantalum, or a combination of any of these in elemental, compound, alloy or other form. In some examples, the microstructure may be in the form of a layer or coat at least partly, or substantially completely covering the respective surfaces of the diamond grains. For example, the microstructure may be in the form of a coating layer comprising nickel, boron, silicon, titanium or tantalum, or a combination of any of these in elemental, compound, alloy or other form, and in some examples the microstructure may be in the form of a coating layer comprising boron carbide, $B_4C$, titanium carbide (TiC), tantalum carbide (TaC). In some examples, the microstructure may be in the form a particulate structure attached to the surfaces of the diamond grains.

In some examples, a plurality of the microstructures may be attached to the surfaces of the diamond grains. For example, a first microstructure may be a layer or coating directly attached to the respective diamond grain surfaces and a second microstructure may be a layer or coating attached to the first microstructure. In some examples, the first microstructure may comprise carbide compound material including material as comprised in the second microstructure and carbon from the surface of the diamond grain.

According to a third aspect, there is provided a mixture comprising a plurality of the diamond grains according to an aspect of this disclosure dispersed in bond material for a tool or precursor material for bond material for a tool.

In some examples, the mixture may comprise a plurality of pellets, each pellet containing one or more of the plurality of diamond grains encapsulated within a structure comprising the bond material or the precursor material for bond material.

In some examples, the mixture may comprise the diamond grains dispersed in a solid matrix, vitreous material, resinous material, polymer material, within an electroplated layer, dry powder, slurry or paste comprising the bond material or precursor material for bond material.

In some examples, the bond material or the precursor material for bond material may include nickel, cobalt, iron, alloys including iron, nickel or cobalt, braze material, tungsten carbide, resin material, vitreous material, silicon, silicon carbide or silica.

Figure 2:
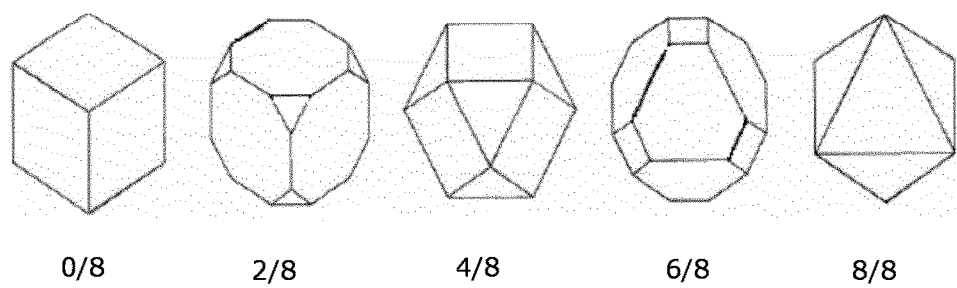
Figure 3A:
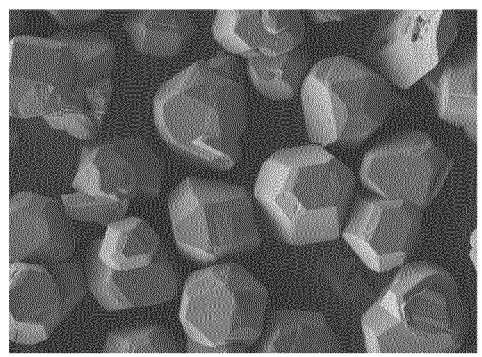
Figure 3B:
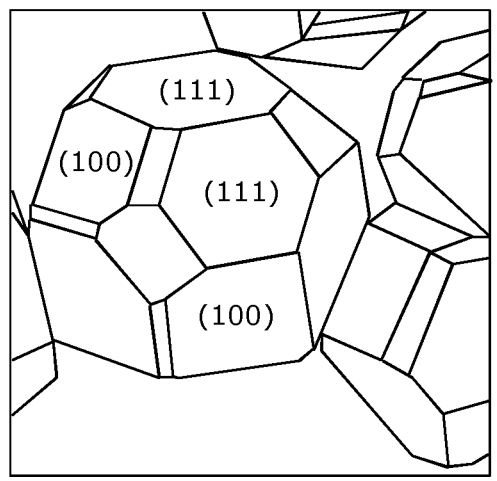
Figure 4A:
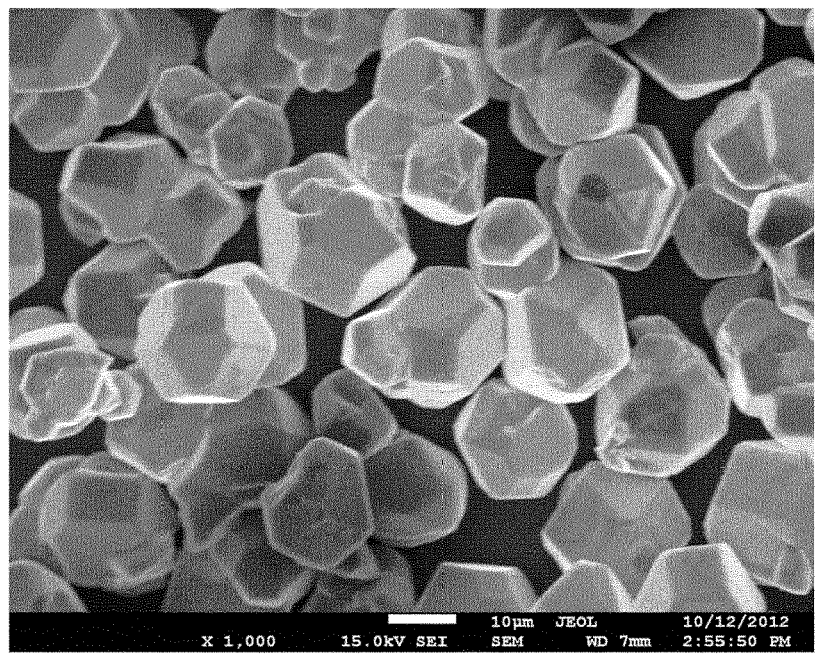
Figure 4B:
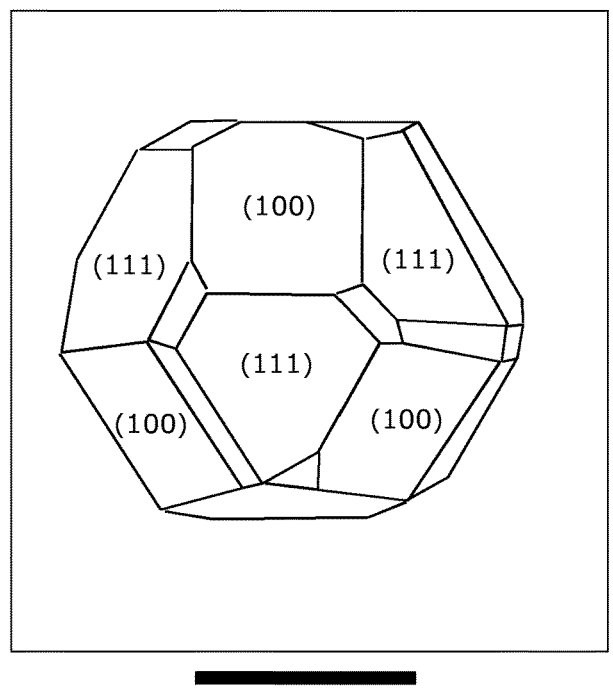

Non-limiting example methods, arrangements and diamond grains will be described below with reference to the accompanying drawings, of which FIG. 1 shows a schematic cross section view of part of a capsule assembly for an ultra-high pressure furnace;

FIG. 2 shows a morphology index for synthetic diamond crystals;

FIG. 3A shows an electron microscope image of diamond grit produced according to the disclosure and FIG. 3B shows an expanded line trace of the crystal facets of one of the crystals evident in FIG. 3A (surrounding crystals are also partially shown); and FIG. 4A shows another electron microscope image of diamond grit produced according to the disclosure and FIG. 4B shows an expanded line trace of the crystal facets of one of the crystals evident in FIG. 4A.

With reference to FIG. 1, an example capsule assembly 100 comprises a solid cylindrical synthesis assembly 110 and a pair of solid cylindrical buffer bodies 120 at opposite ends of the synthesis assembly 110, each separated from the synthesis assembly 110 by a respective barrier disc 130. The barrier discs 130 comprise kaolin-based mineral fibres and is in the form of a thin, flexible fabric (for example, such fabric is commercially available under the brand name Kaowool™). The synthesis assembly 110 comprises a mixture of graphite, iron and nickel, all in powder form, as well as a plurality of diamond seed grains. In this example, the buffer bodies 120 consist of compacted graphite powder.

In a particular example, the diameter of the synthesis assembly 110 and the buffer bodies 120 is 40.5 millimeters.

The heights of the synthesis assembly 110 is 15.4 millimeters and of each of the buffer bodies 120 is 4.8 millimeters. The overall ratio of the mass of metal to graphite in the capsule assembly may be 1.86. The synthesis assembly 110 may comprise 30 grams graphite powder, 103 grams iron (Fe) powder and 44 grams nickel (Ni) powder, the ratio of Fe to Ni therefore being about 2.34 and ratio of metal to graphite being 4.9. Each of the buffer bodies 120 may comprise 24.5 grams of compacted graphite powder, the total combined mass of graphite in the capsule assembly 100 being 79 grams (24.5 grams times 2, plus 30 grams) and the overall ratio of metal to graphite being 1.86 (147 grams of metal powder divided by 79 grams of graphite). The mass of graphite in the synthesis assembly 110 is selected to be 30 grams in order to yield at least about 15 grams (75 carats) of diamond grains. The seed grains may be diamond grains having mean size in the range of about 0.5 micron to about 5 microns. In a particular example, the diamond seed grains may have a mean size in the range of about 1.5 to about 2 microns, at least about 90 percent of the seed grains being at most about 4.5 or at most about 4 microns, and a specific surface area in the range of about 3.2 to about 3.6 square meters per gram. The synthesis assembly 110 may be made by blending the graphite, iron and nickel powder with the diamond seeds to achieve a substantially homogeneous dispersion of the diamond seeds within the blended powder, and compacting the blended powder at ambient temperature by means of a uni-axial compaction press. In a particular example, the diamond seed grains may not be coated and may be provided by a method including crushing of coarser diamond grains, the resulting finely sized grains to be used as the seed grains having irregular shape.

The capsule assembly 100 comprising the synthesis assembly 110, the buffer bodies 120 and the barrier discs 130 is contained within a reaction vessel 140 defining a closed cylindrical inner volume and formed by a pair of oppositely facing cups. The reaction vessel 140 may consist of a refractory ceramic material. The capsule assembly 100 can be further assembled into a capsule for a cubic ultra-high pressure furnace (press) and subjected to a pressure of at least about 5.5 gigapascals and a temperature of at least about 1,300 degrees Celsius. The pressure and temperature will be such that diamond is more thermodynamically stable than graphite and that the metal will be in molten form. The synthesis assembly 110 may comprise two suitable catalyst materials for growing diamond, the metals and their relative masses being selected such that the metals in combination and in the presence of carbon will be substantially minimum at the ultra-high pressure (this will be substantially the eutectic composition at the pressure). The pressure should be sufficiently low for avoiding substantial spontaneous nucleation of diamond grains. For example, the pressure may be at least about 5.5 gigapascals and at most about 5.8 gigapascals, and the temperature may be at least about 1,250 degrees Celsius and at most about 1,350 degrees Celsius.

In a particular example synthesis cycle, load and heat may be applied to the capsule in three stages. In the first stage, the load may be increased before heat is applied, such that the pressure in the capsule assembly is increased at ambient temperature to about 4.5 gigapascals. In the second stage, heat may be applied and the temperature is increased to about 1,300 degrees Celsius, sufficiently high for the metal in the synthesis assembly to become molten. Although the application of heat will likely result in some further increase in pressure, it may be desired that the pressure will be less than about 5.2 gigapascals at the end of the second stage, at which condition diamond is expected to be less thermally stable than graphite. The condition of the second stage should be maintained for a sufficiently short time that substantially all of the seed grains are preserved. In the third stage, further load may be applied to increase the pressure to at least about 5.5 gigapascals and at most about 5.9 gigapascals to achieve a condition at which diamond is more thermodynamically stable than graphite, and dissolved carbon from the graphite can precipitate on the diamond seeds and the diamond grains can grow. The condition at the end of the third stage may be substantially maintained for a synthesis period of about 60 seconds, after which the temperature may be reduced to solidify the metal and the pressure and temperature may be reduced to the ambient levels.

In various examples, the size distribution of the synthesised diamond grains will depend on the number of seed grains in the synthesis assembly, since the mass of grown diamond will be distributed over the seeds. If a mean grain size in the range of about 10 microns to 30 microns is targeted, the content of the seed grains in the synthesis assembly may be in the range of about 2 grams (10 carats) to about 4 grams (20 carats) per kilogram of the synthesis assembly. The table below shows further examples of seed content within the synthesis assembly depending on the targeted mean size of the synthesised diamond grains.

| Targeted approximate mean size of synthesised diamond grains, microns | Estimated seed content in grams of seeds per kilogram of synthesis assembly (the seeds having mean size in the range 1 to 3 microns) |
|---|---|
| Less than 10 | 4-10 |
| 10 | 2-4 |
| 20 | 1-2 |
| 50 | 0.2-1 |
| 100 | 0.2-0.5 |

After the synthesis process, the capsule assembly can be removed from the capsule. Depending on the material comprised in the barrier between the reaction bodies and the buffer bodies at either end of it, these bodies may readily separate from each other (for example, barrier material comprising kaolin-based fabric is likely to have this aspect). The buffer bodies can be disposed of and the synthesis assembly processed to recover the synthesised diamond grains. The recovery process may include crushing the synthesis assembly by means of a jaw crusher, for example, to reduce the synthesis assembly to a plurality of granules having mean size of about 1 millimeter or less, and digesting the granules in acid to remove the metal. The residue from the acid digestion, which will include the diamond grains and probably some graphite, may then be washed, dried and milled. The residue may be subject to further acid digestion, washing and drying, and then sieved to recover diamond grains in the targeted size range.

With reference to FIG. 2, the synthetic diamond crystals may have a range of shapes from cubic, corresponding to a morphology index of 0, to octahedral, corresponding to a morphology index of 8, and various shapes between these comprising octahedral and cubic faces. A diamond crystal may have mixed morphology, in which a part of the crystal may have a different morphology index from another part of the crystal. Diamond crystals may also exhibit minor faces in addition to and between the cubic and or octahedral faces, and may also exhibit crystallographic twinning. The surfaces of synthetic diamond crystals may be smooth or exhibit various kinds of features, such as striations, dendritic micro-formations or pitting, which may arise form etching of the diamond surface or from the environment of the crystal during its synthesis. Crystals may also exhibit deformations arising from growth competition and or physical interaction with other crystals during synthesis, and or from mechanical degradation of the crystal after synthesis.

A plurality of diamond grains produced using the disclosed method, as described above, was tested by means of a cutting test. FIG. 3A and FIG. 4A show micrographs of some of the crystals produced, and FIG. 3B and FIG. 4B show respective expanded line traces of the crystal facets of one of the crystals evident in each of FIG. 3A and FIG. 4A (surrounding crystals are also partially shown in FIG. 3B). The size distributions both of the diamond seed grains and the synthesised diamond grains were measured by means of a laser diffraction method, more particularly by means of a Malvern Mastersizer™ apparatus, and statistical parameters of the respective size distributions are provided in the table below:

|  | Seed grains size, microns | Synthesised grain size, microns |
| --- | --- | --- |
| Surface-based mean size D[3, 2] | 1.7 | 18.6 |
| Volume-based mean size D[4, 3] | 3.2 | 20.0 |
| d(0.1) | 1.0 | 13.7 |
| d(0.5) | 1.9 | 19.3 |
| d(0.9) | 3.9 | 27.2 |
| Specific surface area, $m^2/g$ | 3.4 | 0.322 |

The synthesised grains were tested in an application-related test and the results compared to those of a control test, in which diamond grains obtained by crushing larger grains were used. The test involved preparing a saw for cutting polycrystalline silicon material, in which a plurality of the diamond grains were attached to a saw base by electroplating. The test was carried out using various rates of silicon removal, the performance of the saws being assessed in terms the forces required to drive the saws at each of the material removal rates, which is likely to be inversely related to the potential cutting speed in use. Each saw was examined by means of an electron microscope before and after the tests in order to assess the microstructural environments of the diamond grains.

The saw comprising the synthesised grains required substantially lower cutting force than that comprising the crushed grains, indicating that the synthesised grit was substantially more efficient in cutting the silicon and experienced a substantially lower wear rate than the crushed grains, suggesting the potential for extended tool life.

Wire sawing is an example of a potential application in which synthesised grit according to the present disclosure is likely to exhibit superior performance. Wire saws comprise metallic wire onto the surface of which abrasive grains such as diamond grains may be attached, for example by means of electroplating.

In some example variants of the method, the diamond seed grains may have various attributes. For example, a major fraction of the seed grains may be substantially euhedral, and or the seed grains particles may be provided coated, clad and or encapsulated as disclosed for example in U.S. Pat. No. 5,980,982 or United States patent application publication number 2008/219914. Some example variants of the method may include coating each seed particle with coating structure comprising catalyst material for diamond, or the seeds may be uncoated.

Some example variations of the method may include encapsulating each seed particle in a respective pellet comprising the carbon material and the solvent-catalyst material to provide a plurality of pellets, and combining and compacting the pellets to provide a compact synthesis body. The method may include encapsulating the plurality of diamond seed particles within pellets comprising graphite powder and powder of solvent-catalyst material for diamond, in which each seed is encased within each respective pellet and substantially all the pellets contain only one diamond seed particle. The pellets may be substantially spherical and can be combined and compacted together to provide a solid synthesis assembly. A synthesis assembly thus produced is likely to comprise diamond seed particles arranged in a three dimensional honeycomb like arrangement. In various examples the pellets may be substantially spherical, ovoid, flattened spherical or polygonal.

In some example variants of the method, the seed grains may be placed according to a predetermined pattern onto layers comprising catalyst material and or raw material, as disclosed in U.S. Pat. No. 7,585,366 or 5,980,982. The graphite and the solvent-catalyst material may be at least partly segregated within the synthesis assembly. For example, the graphite and the solvent-catalyst material may be arranged as alternate layers within the local vicinity of each diamond seed particle. The method may include providing a plurality of discs, at least some of which comprise the carbon material and at least some of which comprise the solvent-catalyst material, arranging the seed particles on the discs, stacking the discs on top of one another and compacting the stacked discs to provide the compact synthesis body.

There are various kinds of ultra-high pressure furnaces, also called ultra-high pressure, high temperature (HPHT) presses, that used commercially to manufacture synthetic diamond or cubic boron nitride products. Such presses will be capable of subjecting a capsule comprising raw materials to ultra-high pressures of at least about 3 gigapascals and high temperatures of at least about 1,200 degrees Celsius. Such presses generally provide a cavity for accommodating the capsule and a plurality of anvils for impinging and applying load onto the capsule. Heat can be generated in the capsule by passing an electric current through the anvils, which may comprise cemented carbide material, and through the capsule, which may comprise heater elements for resistive heating. Some kinds of press comprise four or six anvils arranged with tetrahedral and cubic symmetry, respectively, and so-called belt presses comprise two opposing anvils and a die defining the cavity for capsule and supporting the capsule when it is loaded by the anvils. Gasket elements are generally used to prevent or reduce the extrusion of capsule material between the anvils or between the anvils and the die when the capsule is pressurised. Some extrusion may occur and will likely have the effect of reducing the pressure in the capsule, requiring compensating movement of the anvils. The gasket should generally comprise refractory material that is capable of achieving high friction force between the gasket and the anvils, as well as high internal friction so that the gasket is able to resist displacement and distortion as much as possible. On the other hand, the gasket needs to be resiliently deformable in order to permit the anvils to continue closing towards the capsule for the reasons discussed above, in order to maintain or increase the pressure in the capsule assembly. In general, the anvils may have a flat end from which side surfaces extend, inclined at an angle of less than 90 degrees with respect to the end. In other words, the sides of the anvil will generally be sloped rather than perpendicular to the end. Consequently, the end of the anvils will impinge the capsule or a buffer between the anvil and the capsule, and the sides of the anvils will impinge the gaskets. Therefore, both the capsule and the gaskets will be loaded as the anvils are driven inwards towards the capsule and the pressure actually generated within the capsule will depend substantially on the configuration and material of the gasket. In addition, the gaskets and the presence of the other anvils or the die will set a limit to the inward displacement of the anvils.

Designing capsules and gaskets to maximise the yield of saleable diamond grit produced during a synthesis cycle is not generally straightforward. Since some of the anvil load is applied to the gasket as well as to the capsule, increasingly higher loads will need to be applied by the anvils in order to move them towards the capsule. In other words, increasingly larger increments in anvil load will need to be applied to achieve the same marginal increase in load applied to the capsule because an ever-increasing portion of the load will be applied to the gasket. For a given press system (ultra-high pressure furnace), there is likely to be a limit to the possible displacement range of the anvils from the beginning to the end of the cycle and the challenge is to be able to make the most efficient use of the limited range.

The capsule will contain a capsule assembly comprising a synthesis assembly and various containment elements comprising materials capable of sustaining ultra-high pressure and temperature of at least about 1,200 degrees Celsius while maintaining mechanical strength, stiffness and undergoing as little endovolumetric phase change as possible. Such materials may be referred to as refractory and may include certain minerals and ceramic materials such as magnesia and pyrophyllite. The capsule assembly may comprise a refractory ceramic vessel containing the raw materials for diamond synthesis or sintering, depending on whether the intended product is diamond grit or a body comprising a plurality of sintered diamond grains. Means of heating the capsule assembly will also be comprised in the capsule and may include metal or graphite discs and tubes for conducting electric current and generating heat resistively. Metal used for the heating means will generally be refractory metal having high melting point, such as molybdenum, tantalum or niobium.

As heat and load is applied to the capsule, the volume of the components will generally decrease somewhat owing to phase changes, dissolution of graphite source material into the solvent-catalyst material, and conversion of graphite into the denser diamond allotrope and into more stable graphite structures. On the other hand, thermal expansion of components and melting of the solvent-catalyst material will tend to reduce somewhat the net volume decrease. As diamond grains grow during the synthesis process, the volume of the synthesis assembly will tend to decrease and the anvils will need to advance in order to compensate for this effect so that the pressure in the synthesis assembly can be maintained or increased. Some extrusion of capsule material between the anvils may further tend to reduce the pressure in the capsule assembly and need to be compensated by anvil movement towards the capsule.

Unfortunately, it may not be possible to convert all source graphite that could be accommodated in the synthesis assembly to diamond since this would require more anvil movement than may be possible. The number of diamond crystals that can be synthesised can be controlled by dispersing small diamond seed grains in the synthesis assembly and taking care not to pressuring the capsule excessively and thus causing diamond grain to form spontaneously. If too many seed grains are present, there is a risk than the grown diamond grains will be too small or that the pressure in the capsule assembly may decrease later in the synthesis process due to excessive conversion of graphite to diamond. If the anvils reach their limit of displacement, the pressure in the capsule assembly may decrease to below that at which diamond is thermodynamically stable and grown diamond will likely start converting into graphite. If too few seed grains are present, then the growth rate of the diamond grains may be too high, with the consequence that the grown grains are likely to be of poor quality, or the pressure in the capsule assembly may rise excessively in response to the pre-programmed load cycle, resulting in spontaneous nucleation, and the number, size and quality of the grown grains will likely be different from that targeted. It is therefore desired that the number of seed grains be selected according to the targeted size, number and quality of targeted grains, in view of the limitations of the press system and capsule, and that the load and heating cycle also be designed accordingly.

A particular challenge in synthesising very small grains is that the desired grain size is achieved rapidly, in a matter of seconds or a few minutes, and the timing of the load and heat cycle is therefore critical, but unfortunately difficult to control. This may be why most commercially available diamond grains less than about 80 microns in size are manufactured by crushing coarser diamond grains rather than by direct synthesis. Unfortunately, crushed diamond grains tend to be irregular in shape and are difficult and costly to sort, which presents problems for using fine diamond grit in polishing surfaces such as opto-magnetic storage media to sufficient tolerance. It would be better to provide substantially euhedral, well-faceted and "rounder" diamond grains for such applications. In principle, direct synthesis of such grains would probably provide such grains, although this method would need to overcome the challenges mentioned above.

The method according to this disclosure overcomes this problem by ensuring that only graphite required for synthesising the desired diamond grains is present in the synthesis assembly (allowing for other ways in which the graphite may be exhausted during the synthesis process). In some example arrangements, excess graphite is retained in the capsule assembly in order to achieve the overall thermo-mechanical properties of the capsule assembly so that the overall response of the capsule to known load and heat cycles is substantially predictable. This is likely to facilitate optimisation of the synthesis cycle. In these examples, the excess graphite is comprised in buffer elements separated from the synthesis assembly by a barrier. The fact that substantially only the required amount of graphite necessary to produce the diamond grains is present in the synthesis assembly substantially increases the sensitivity of the process to the timing of the heat and load cycle. The process is likely to be substantially more stable and controllable, and the yield of euhedral diamond grains of the desired size, quality and number is likely to be substantially increased.

In general, the pressure will be generated by means of anvils impinging on the capsule from different directions, thus applying load force onto the capsule. The efficiency with which the impingement of the anvils generates force on the capsule and consequently with which pressure is generated will depend on certain mechanical properties of the capsule, particularly the stiffness of the capsule assembly. Since the amount of movement of the anvils will likely be very limited in most ultra-high pressure press apparatuses used for the commercial manufacture of diamond grains, it may generally be desired that relatively small anvil displacements can provide and sustain sufficient load on the capsule to generate pressures of at least about 5.5 gigapascals. For this to occur, the mechanical stiffness of the capsule assembly will need to be sufficiently great. If the overall content of graphite in the capsule assembly is too high relative to the content of metal, the capsule assembly may not be sufficiently stiff owing to the fact that graphite is relatively compliant relative to metal materials suitable for diamond synthesis (put diffidently, the elastic modulus of graphite is substantially lower than that of the metals). On the other hand, if the capsule assembly is too stiff, loading and pressurisation of the capsule may be difficult to control. Therefore, the stiffness and consequently the overall mass ratio of metal to graphite in the capsule assembly should be within a range known to be suitable for a particular combination of press design, capsule design and gasket design (a gasket will generally be placed between the anvils in order to seal in the capsule material). For example, the overall metal to graphite ratio for a capsule assembly for a cubic press (in which six anvils impinge of a cubic shaped capsule from six sides, three pairs of anvils impinging from opposite directions along three orthogonal axes) may be in the range from about 1 to about 3.

A likely aspect of using graphite for the buffer bodies may be that substantially the same capsule design (other than the capsule assembly) can be used to manufacture diamond grains with or without the buffers. It is known to synthesise diamond grains using reaction bodies without buffer bodies, in which a substantial amount of the source graphite in the synthesis assembly is not exhausted during the synthesis process. In example arrangements of the disclosed method, in which the buffer bodies comprise graphite, the overall metal to graphite mass ratio within the capsule assembly may be substantially preserved by segregating graphite that will not be exhausted during the process of growing the diamond grains. Therefore, the overall relevant mechanical properties of the capsule assembly at the pressures and temperatures experienced during the synthesis cycle are likely to be substantially preserved. Consequently, less adaptation of the capsule and gasket arrangement, and at least the initial phase of the synthesis cycle may be required when implementing the disclosed method. Rearrangement of the capsule assembly such that excess graphite is located in a separate volume of the capsule assembly, substantially separated from the synthesis assembly by a barrier, is likely to have the aspect of enhanced controllability of the synthesis process and consequently the potential for producing a relatively high yield of very high quality, substantially euhedral, fine (small) diamond grains having a mean size of tens of microns or less. A further aspect of the disclosed method is likely to be the relative ease with which the diamond grains can be recovered from the synthesis assembly after the synthesis process, since the amount of excess graphite from which the diamond grains need to be separated is substantially less.

In general, the mass of the graphite powder in the synthesis assembly will be selected to be substantially just sufficient to achieve the combined mass of diamond grains desired to be grown on the seed grains. In other words, it is intended for substantially all the graphite in the synthesis assembly to be exhausted in the process of growing the diamond grains having a desired size distribution. Therefore, the effect will be that there is relatively little or substantially no graphite in the synthesis assembly that practically available for further conversion to diamond when the targeted mean size of the diamond grains is achieved. In this way, there will be an effective limit on the size distribution of the grown diamond grains, even if the synthesis condition is maintained after the desired diamond grain size has been achieved.

Reducing the content of graphite in the synthesis assembly in order to achieve this would likely present new challenges arising from the substantial changes in certain thermo-mechanical properties of the capsule. This may be addressed by substantial re-design of the capsule, the gasket and or the load and heat cycle. According to certain disclosed example arrangements, the effect of limiting the graphite (or other carbon source material) content in the synthesis assembly may be reduced or substantially eliminated by introducing at least one buffer assembly within the capsule assembly, particularly but not exclusively a buffer assembly comprising or consisting of an amount of graphite equal to that excluded from the synthesis assembly. The overall thermal and mechanical properties and behaviour of the capsule assembly may thus be preserved.

In practice, not all the graphite comprised in the synthesis assembly will likely be available for growing the diamond grains. Some of the graphite will be exhausted by conversion to diamond and some will be in effect exhausted in other ways, in the sense of being practically unavailable for conversion to diamond. While wishing not to be bound by a particular theory, the graphite may be exhausted during the diamond synthesis process in at least three ways, namely in the conversion of the graphite to diamond, the conversion of some of the graphite into thermodynamically more stable graphite structures, and the dissolution of graphite in the molten metal. For example, if the synthesis assembly comprises 147 grams of metal and the solubility of carbon in the metal at the synthesis condition is 2 weight percent, then about 3 grams of carbon would be exhausted by solution in the molten metal and therefore unavailable for precipitation as diamond. If the content of graphite in the synthesis assembly is 30 grams, this would account for about 10 percent of the source graphite. In addition, some of the graphite material at the cores of graphite grains may be isolated from the molten metal by the formation of a surrounding coat structure of more stable and consequently less soluble graphite, for example.

In various examples, it may be possible to achieve conversion rates of the graphite to diamond of at least about 50 percent, at least about 60 percent, at least about 70 percent or at least about 80 percent. While wishing not to be bound by a particular theory, the conversion rate achievable may depend on various aspects such as the metal materials used, the quality and size of the graphite raw material powder, the number of seed grains in the synthesis assembly, and the pressure and temperature conditions used. It may be expected that the mean spacing between the source graphite and the diamond seeds may influence the efficiency of graphite conversion to diamond. Arrangements in which the mean spacing between the source graphite and the diamond seeds is relatively small may be expected to result in greater conversion of graphite to diamond in the synthesis process.

Diamond crystals grown according to the disclosed method are likely to have the aspect of reduced content of impurities and inclusions surrounding the seed particles on which they are grown. Since impurities and inclusions tend to have a significant effect on the strength of diamond crystals, the crystals made using this method are likely to have substantially enhanced strength.

Various concepts and terms as used herein will be briefly explained.

The crystal habit of a crystal describes its visible external shape. Near-perfect to perfectly formed crystals can be described as being euhedral, moderately well formed crystals can be described as subhedral and poorly formed crystals or crystals with no discernible habit can be described as anhedral. In general, synthetic diamond crystals in the form of grains, which may have mean size of less than about 1 millimeter, tend to have cubo-octahedral crystal habit. Depending on the synthesis conditions, the crystal habit of diamond grains may be cubic, octahedral or both cubic and octahedral facets may be present in various proportions, and minor facets may also be present.

The crystal habits of synthetic diamond and cBN crystals is discussed by Bailey and Hedges (M. W. Bailey and L. K. Hedges, 1995, "Crystal morphology identification of diamond and ABN", Industrial Diamond Review, vol. 1/95, pages 11 to 14) using a morphology index, which describes the basic characteristics of crystal shapes in terms of the growth of different crystal faces or planes. For example, the shape of synthetic diamond may be substantially defined by various combinations of (111) and (100) surfaces. Eight-sided diamond crystals having only (111) surfaces may be referred to as having octahedral habit and six-sided diamond crystals having only (100) surfaces may be referred to as having cubic habit. Diamond crystals may have both (100) and (111) surfaces and may be referred to as having cubo-octahedral habit. A diamond morphology index has been developed to assign a integer from 0 (completely cubic habit) to 8 (completely octahedral habit) according to the crystal habit.

Euhedral diamond grains have substantially well-defined facets, and may comprise a relatively small number of relatively large facets, and may have relatively low specific surface area. Diamond grains prepared by crushing larger grains may have irregular shapes.

The size range of abrasive grains may be expressed in terms of U.S. Mesh size, in which two mesh sizes are provided, the first being a mesh size through which the grains would pass and the second being a mesh size through which the grains would not pass. Mesh size may be expressed in terms of the number of openings per (linear) inch of mesh.

As used herein, grain sizes expressed in length units such as micrometers (microns), as opposed to mesh size, will refer to the equivalent circle diameters (ECD), in which each grain is regarded as though it were a sphere. The ECD distribution of a plurality of grains can be measured by means of laser diffraction, in which the grains are disposed randomly in the path of incident light and the diffraction pattern arising from the diffraction of the light by the grains is measured. The diffraction pattern may be interpreted mathematically as if it had been generated by a plurality of spherical grains, the diameter distribution of which being calculated and reported in terms of ECD. Aspects of a grain size distribution may be expressed in terms of various statistical properties using various terms and symbols. Particular examples of such terms include mean, median and mode. The size distribution can be thought of as a set of values $D_i$ corresponding to a series of respective size channels, in which each $D_i$ is the geometric mean ECD value corresponding to respective channel i, being an integer in the range from 1 to the number n of channels used.

Mean values obtained by means of laser diffraction methods may be most readily expressed on the basis of a distribution of grain volumes, the volume mean can be represented as $D[4,3]$ according to a well-known mathematical formula. The result can be converted to surface area distribution, the mean of which being $D[3,2]$ according to a well-known mathematical formula. Unless otherwise stated, mean values of size distributions as used in the present disclosure refer to the volume-based mean $D[4,3]$. The median value D50 of a size distribution is the value dividing the plurality of grains into two equal populations, one consisting of grains having ECD size above the value and the other half having ECD size at most the value. The mode of a size distribution is the value corresponding to the highest frequency of grains, which can be visualised as the peak of the distribution (distributions can include more than one local maximum frequency and be said to be multi-modal). Various other values d(y) can be provided, expressing the size below which a fraction y of the plurality of grains reside in the distribution. For example, d(0.9) refers to the ECD size below which 90 percent of the grains reside, d(0.5) refers to the ECD size below which 50 percent of the grains reside and d(0.1) refers to the ECD size below which 10 percent of the grains reside.

As used herein, ultra-high pressure is sufficient for synthesising diamond material under conditions at which diamond is thermodynamically more stable than graphite. Examples of ultra-high pressure include pressures of at least about 3 gigapascals.

As used herein, an ultra-high pressure furnace is an apparatus capable of subjecting a synthesis assembly for synthesising diamond material to an ultra-high pressure and a temperature of at least about 1,200 degrees Celsius.

As used herein, spontaneous formation of diamond nuclei (spontaneous nucleation) is a phenomenon in which a diamond structure is formed other than by a process involving deposition of carbon in the form of diamond material on an existing diamond structure.

As used herein, solvent-catalyst material for diamond is capable of promoting the precipitation of carbon in the form of diamond at conditions at which diamond is thermodynamically more stable than graphite.

While wishing not to be bound by a particular theory, solvent-catalyst material may promote the growth of diamond crystals principally or exclusively by dissolving a source of carbon and transporting atoms or molecules comprising the source to a seed particle or partially grown crystal to which it becomes attached. Examples of solvent-catalyst material for diamond include iron, nickel, cobalt and manganese or certain alloys including any of these, which are capable of promoting the growth of diamond crystals from a source of carbon such as graphite at ultra-high pressure and high temperature at which diamond is thermodynamically more stable than graphite and the catalyst material is in the liquid state. The solvent and catalytic effects are likely to be particularly strong when the catalyst material is in the liquid state.

The invention claimed is:

1. A method of providing a plurality of euhedral diamond grains having a mean size of greater than 5 microns and at most 100 microns, the method including:
   providing a synthesis assembly comprising:
   a source of carbon material,
   a plurality of seed grains on which diamond material can crystallise, and solvent-catalyst material for promoting the crystallisation of the diamond grains;
   subjecting the synthesis assembly to a synthesis condition by means of an ultra-high pressure furnace, at which synthesis condition the pressure and temperature are such that the solvent-catalyst material is molten, diamond material can crystallise on the seed grains, and spontaneous nucleation of diamond grains does not occur;

the synthesis assembly being arranged such that carbon comprised in the source can migrate through the solvent-catalyst material and crystallise as diamond material on the seed grains at the synthesis condition;

the synthesis condition being maintained for a synthesis period sufficient for at least 50 percent of the carbon material comprised in the source to be converted into the plurality of diamond grains;

the number of seed grains and the amount of carbon material comprised in the source being selected such that the synthesis condition can be maintained by the ultra-high pressure furnace for the synthesis period;

reducing the pressure and temperature, and recovering the plurality of diamond grains from the synthesis assembly, and further comprising subjecting the synthesis assembly to a load and heat cycle comprising three stages, the first stage including applying load onto the synthesis assembly such that the pressure therein is increased at ambient temperature to a first pressure in the range of 1 gigapascal to 5 gigapascals; the second stage including applying heat to the synthesis assembly such that the solvent-catalyst material melts; and the third stage including increasing the load such that the pressure in the synthesis assembly is increased to at least 5.5 gigapascals and achieving the synthesis condition.

2. A method as claimed in claim 1, in which the amount of carbon material comprised in the source, the number of seed grains and the synthesis period are selected such that all the carbon material comprised in the source is exhausted by the end of the synthesis period.

3. A method as claimed in claim 1, in which the mean size range of the diamond grains is at least 10 microns and at most 50 microns and in which the seed grains comprise diamond material and have a mean size of at least 0.5 micron and at most 5 microns.

4. A method as claimed in claim 1, in which the solvent-catalyst material comprises metal material and the ratio of the mass of the solvent-catalyst material to the mass of the carbon source comprised in the synthesis assembly is at least about 3 and at most about 10.

5. A method as claimed in claim 1, including providing a capsule assembly comprising a buffer assembly and the synthesis assembly, the buffer assembly being free of seed grains; in which the buffer assembly and the synthesis assembly are configured and constituted such that the ultra-high pressure furnace is capable of maintaining the synthesis condition for the synthesis period.

6. A method as claimed in claim 5, in which the capsule assembly comprises a barrier structure for preventing substantial transfer of material between the synthesis assembly and the buffer assembly at the synthesis condition.

7. A method as claimed in claim 5, in which the solvent-catalyst material comprises metal material and the buffer assembly comprises the carbon material; the ratio of the mass of the solvent-catalyst material to the combined mass of the carbon material in the capsule assembly being at least 1 and at most 3.

8. A method as claimed in claim 1, in which the pressure, in the third stage, is at least 5.5 gigapascals and at most 5.9 gigapascals.

9. A method as claimed in claim 1, in which the solvent-catalyst material comprises iron and nickel.

10. A method as claimed in claim 1, in which the synthesis assembly comprises a compact synthesis body, which comprises the carbon material for the source, the seed grains and the solvent-catalyst material.

11. A method as claimed in claim 1, including processing the plurality of diamond grains to select a plurality of selected diamond grains.

12. A method as claimed in claim 11, including depositing material onto the surfaces of the selected diamond grains to provide microstructures attached to the selected diamond grains.

13. A method as claimed in claim 12, in which the material is capable of reacting with carbon to form carbide compound material.

14. A method as claimed in claim 12, in which the microstructure comprises titanium carbide.

15. A method as claimed in claim 11, including combining a plurality of the selected diamond grains with bond material for a tool or with precursor material for bond material for a tool, to provide a mixture.

* * * * *